United States Patent [19]

Kumanoya et al.

[11] Patent Number: 5,208,778
[45] Date of Patent: May 4, 1993

[54] DYNAMIC-TYPE SEMICONDUCTOR MEMORY DEVICE OPERABLE IN TEST MODE AND METHOD OF TESTING FUNCTIONS THEREOF

[75] Inventors: Masaki Kumanoya; Katsumi Dosaka; Yasuhiro Konishi; Takahiro Komatsu; Yoshinori Inoue, all of Hyogo, Japan

[73] Assignee: Mitsubishi Denki Kabushiki Kaisha, Tokyo, Japan

[21] Appl. No.: 739,736

[22] Filed: Jul. 30, 1991

Related U.S. Application Data

[63] Continuation of Ser. No. 432,837, Nov. 7, 1989, abandoned.

[30] Foreign Application Priority Data

Nov. 16, 1988 [JP] Japan .................. 63-290705

[51] Int. Cl.[5] .................. G11C 5/06; G11C 29/00
[52] U.S. Cl. .................. 365/201; 365/63; 371/21.1; 371/21.2
[58] Field of Search .................. 365/51, 63, 200, 201; 371/10.1, 10.2, 10.3, 21.1, 21.2

[56] References Cited

U.S. PATENT DOCUMENTS 4,692,900  9/1987  Ooami et al. .................. 365/201
4,866,676  9/1989  Crisp et al. .................. 365/201

OTHER PUBLICATIONS

Masaki Kumanoya et al., "A Reliable 1-Mbit DRAM with a Multi-Bit-Test Mode", IEEE Journal of Solid State Circuits, vol. SC20. No. 5, Oct. 1985, pp. 909–913.
Koichiro Mashiko et al., "A 90ns 4Mb DRAM in a 300 mil DIP", IEEE International Solid State Circuits Conference 1987, pp. 12–13.

Primary Examiner—Joseph L. Dixon
Assistant Examiner—Jack A. Lane
Attorney, Agent, or Firm—Lowe, Price, LeBlanc & Becker

[57] ABSTRACT

A dynamic-type semiconductor memory device has a test mode of simultaneously carrying out functional testing on a plurality of bits of memory cells. In data writing in the test mode, data inverted from the write-in data is written in at least a 1-bit memory cell out of the plurality of bits of memory cells selected simultaneously, and the same data as the write-in data is written in the remaining memory cells. In data reading in the test mode, the data of those of the memory cells selected simultaneously, in which the inverted data is written are inverted and read, while the data of the remaining memory cells are read as they are. Logic processing is carried out on the read-out data of the plurality of bits, so that a logic value indicating acceptability of the semiconductor memory device is output, depending on a result of determination as to whether or not the read-out data is the same as each other.

20 Claims, 7 Drawing Sheets

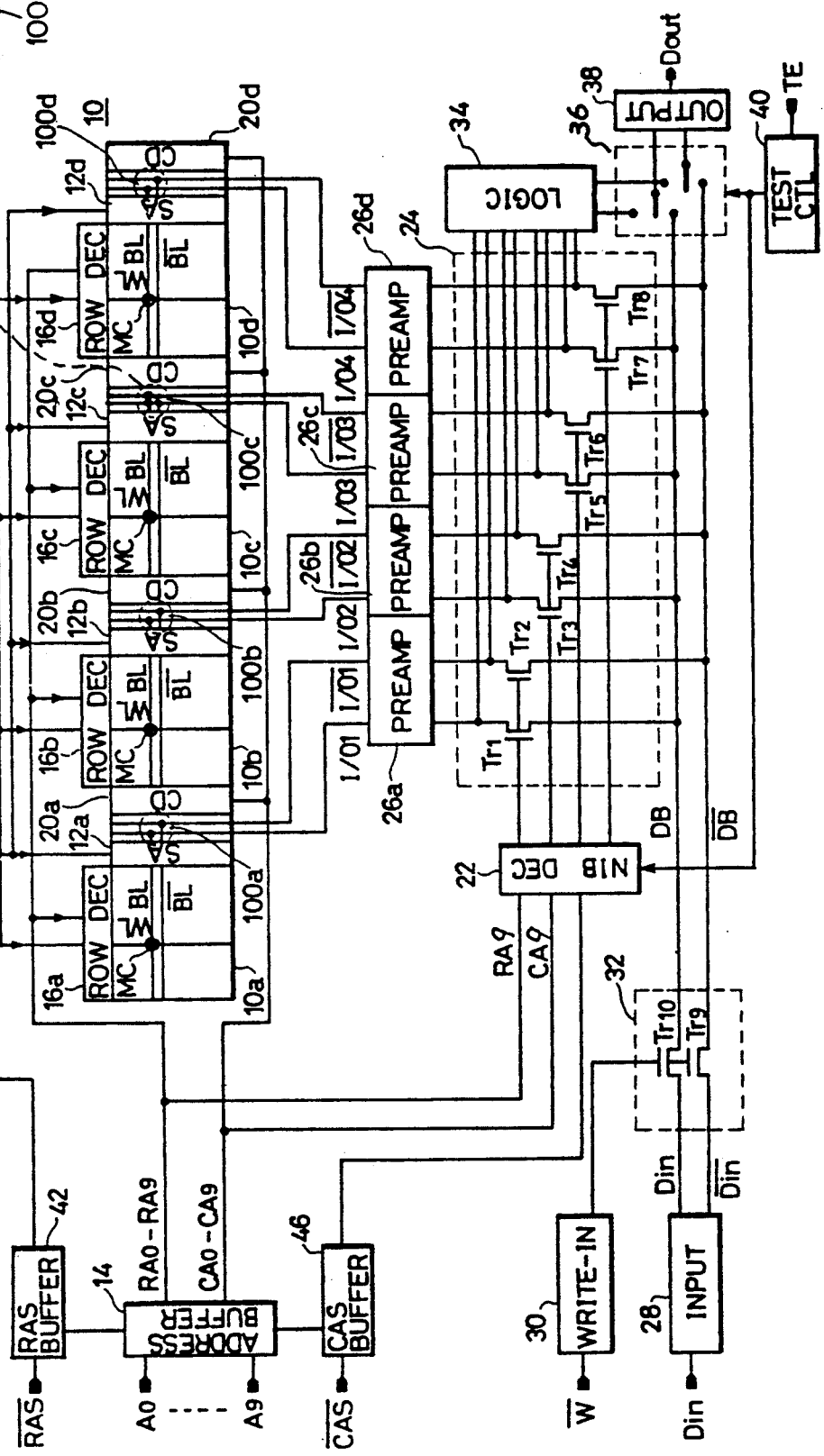

DYNAMIC-TYPE SEMICONDUCTOR MEMORY DEVICE OPERABLE IN TEST MODE AND METHOD OF TESTING FUNCTIONS THEREOF

This application is a continuation application of application Ser. No. 07/432,837, filed Nov. 7, 1989 now abandoned.

BACKGROUND OF THE INVENTION

1. Field of the Invention

The present invention relates to dynamic-type semiconductor memory devices, and in particular to improvements of a dynamic-type semiconductor memory device with functions of simultaneously testing of a plurality of bits of memory cells during functional testing of memory cells included in a semiconductor memory device. More particularly, it relates to a configuration for and method of reliable functional testing of the semiconductor memory device.

2. Description of the Background Art

In recent years, with an increased capacity of a semiconductor memory device, a problem has arisen in that it requires a much longer period of time for functional testing of whether memory cells in the memory device are normally operating or not. That is, as the capacity of the semiconductor memory device has increased, the number of the memory cells included therein has also increased, and accordingly a problem has occurred that a time period required for functional testing of all the memory cells has greatly increased with the number of memory cells. In such configuration, functional testing is carried out in a conventional way of sequentially reading the stored contents of the memory cells on a bit-by-bit basis. A configuration with a much reduced time for functional testing was proposed in the article entitled "A reliable 1-M bit DRAM with a multi-bit-test mode" by Kumanoya et al. in the IEEE Journal of Solid State Circuits, Vol. SC-20 No. 5, Oct., pp. 909–912. The article proposed a method of simultaneously carrying out functional testing of a plurality of memory cells by simultaneously selecting the memory cells of a plurality of bits in a semiconductor memory device, and outputting a certain logic value to the outside of the memory device when logic values of information read out from the memory cells simultaneously selected are all the same. An operation mode for simultaneously carrying out functional testing of the plurality of memory cells is hereinafter referred to as a test mode. The above method of functional testing has now been in practical use.

FIG. 1 illustrates one example of a configuration of a conventional semiconductor memory device having such test mode. A simple configuration of 1-megabit random access memory (hereinafter referred to as 1 MDRAM) is shown in FIG. 1.

In FIG. 1, a memory cell array 10 is divided into four memory cell array blocks 10a, 10b, 10c and 10d. For 1 MDRAM, each of the memory cell array blocks 10a-10d has 256K-bit memory cells. Each of the memory cell array blocks 10a-10d, has a memory cell array arranged in a matrix of rows and columns, and word lines WL for selecting a row of memory cells and bit line pairs BL, $\overline{BL}$ each connecting a column of memory cells. The bit line BL and the complementary bit line $\overline{BL}$ are arranged in a pair, and each memory cell MC is provided at the intersection of the word line WL and one of the bit lines BL, $\overline{BL}$ in a pair. That is, the bit lines BL, $\overline{BL}$ provide a folded bit line scheme. Sense amplifiers 12a-12d for sensing and amplifying information of the selected memory cells are respectively provided in the memory cell array blocks 12a-12d. Each of the sense amplifiers 10a-10d comprises unit sense amplifiers each provided for a bit line pair BL, $\overline{BL}$. Therefore, each of the sense amplifier 12a-12d comprises 512 unit sense amplifiers in case of the 1 MDRAM.

In order to select one word line i.e., one row of the memory cell array 10, i.e. in each of the memory cell array blocks 10a-10d, there are provided an address buffer 14 for generating internal row address signals RA0-RA9 responsive to externally supplied address signals A0-A9, and row decoders 16a-16d for receiving the internal row address signals RA0-RA8 from the address buffer 14 to select a word line in each memory cell array block. The row decoders 16a-16d decode the row address signals RA0-RA8 such that each selects a corresponding word line and transmit a word line driving signal WL applied from a word driver 18 onto the selected word line.

In order to select a bit line pair BL, $\overline{BL}$ from each of the memory cell array blocks 10a-10d, column decoders 20a-20d are provided for selecting corresponding bit line pairs in response to internal column address signals CA0-CA8 from the address buffer 14. The address buffer 14 receives row and column addresses in a time divisional manner to generate the internal row address signals RA0-RA9 and the internal column address signals CA0-CA9 in a time-divisional manner.

A nibble decoder 22 and a selecting gate 24 are provided for simultaneously or sequentially selecting out of 1-bit or 4-bits according to an operation mode out of 4-bit memory cells simultaneously selected in the memory cell array blocks 10a-10d. The selecting gate 24 comprises transfer gate transistors Tr1, Tr2 for connecting internal data lines DB, $\overline{DB}$ to data input/output lines I/O1, I/O1 of the memory cell array block 10a, transfer gate transistors Tr3, Tr4 for connecting the internal data lines DB, DB to a data input/output line pair I/O2, I/O2 of the memory cell array block 10b, transfer gate transistors Tr5, Tr6 for respectively connecting the internal data lines DB, DB to data input/output lines I/O3, I/O3 of the memory cell array block 10c, and transfer gate transistors Tr7, Tr8 for respectively connecting the data lines DB, $\overline{DB}$ to data input/output lines I/O4, I/O4 of the memory cell array block 10d.

The nibble decoder 22 receives an internal row address signal RA9 and an internal column address signal CA9 applied from the address buffer 14, so that only one set of transfer gate transistors in the selecting gate 24 is rendered conductive in a normal mode, while the sets of transfer gate transistors in the selecting gate 24 designated by the internal address signals RA9, CA9 are cyclically and sequentially rendered conductive in a nibble mode. The normal mode is an operation mode for carrying out 1-bit data input/output for one memory cycle (while a signal $\overline{RAS}$ is logical low or the "L" level) in the semiconductor memory device. The nibble mode is an operation mode for first selecting a 1-bit memory cell in response to a row address and a column address externally provided, and after writing or reading the memory cell data, toggling a $\overline{CAS}$ signal with the signal $\overline{RAS}$ remaining at the "L" level, and writing or reading the succeeding 3-bit memory cell data in sequence. Since the row and column addresses need not be set for each memory cell in the nibble mode, the writing/reading of the memory cell data can be carried out more rapidly than in the common normal mode of 1-bit unit.

Preamplifiers 26a-26d for amplifying the given data are provided between the selecting gate 24 and the memory cell array 10. The preamplifier 26a is provided corresponding to the memory cell array block 10a, and the preamplifiers 26b-26d are provided corresponding to the memory cell array blocks 10b-10d, respectively, as well.

For data writing, there are provided an input buffer 28 for receiving and waveform-shaping write-in data Din which are externally provided, and generating e.g. complementary internal write-in data Din, $\overline{Din}$, a writing buffer 30 for generating an internal write signal W responsive to a write signal $\overline{W}$, and a writing gate 32 responsive to the internal write signal W from the writing buffer 30 to be ON for transmitting the internal write-in data Din, $\overline{Din}$ from the input buffer 28 onto the internal data bus lines DB, $\overline{DB}$. The writing gate 32 comprises a transfer gate transistor Tr10 for transmitting the internal write-in data Din onto the internal data line DB and a transfer gate transistor Tr9 for transmitting the complementary (inverted) internal write-in data $\overline{Din}$ onto the complementary data line $\overline{DB}$.

For data reading, an output buffer 38 is provided for receiving via a reading gate 36 and outputting either the data on the internal data line DB, $\overline{DB}$ or the output of a logic operation circuit 34. The reading gate 36 selects either a complementary data pair of the internal data lines DB, $\overline{DB}$ or a complementary data pair indicating a logic result of the logic operation circuit 34 responsive to a control signal from a test control circuit 40 and sends it to the output buffer 38. The output buffer 38 outputs read-out data Dout corresponding to the complementary data pair received.

The logic operation circuit 34 receives the data read out via the preamplifiers 26a-26b and after carrying out a predetermined logic operation, outputs the logic result from the complementary data pair indicating the logic result thereof.

As peripheral circuitry for controlling the operation of the semiconductor memory device, there are provided a RAS buffer 42 for receiving a row address strobe signal $\overline{RAS}$ which is externally supplied to output an internal control signal RAS, a word driver 18 for generating a word line driving signal WL in response to the internal control signal from RAS buffer 42, a sense amplifier control circuit 44 for generating activating signals SO, $\overline{SO}$ to the respective sense amplifiers 12a-12d in response to the signal from the word driver 18, and a CAS buffer 46 for receiving a column address strobe signal $\overline{CAS}$ externally provided to generate an internal control signal. The internal control signal from the RAS buffer 42 defines an operation timing of a row selection circuitry in the semiconductor memory device. On the other hand, the internal control signal from the CAS buffer 46 defines the operation of a column selection circuitry in the semiconductor memory device.

For switching between the functional testing mode of the semiconductor memory device and the common data output/input mode of 1-bit unit, a test control circuit 40 is provided for generating an internal test mode instructing signal responsive to a test mode instructing signal TE externally provided. The internal test mode instructing signal from the test control circuit 40 is applied to the nibble decoder 22 and the reading gate 36. The nibble decoder 22 renders all the transfer gate transistors Tr1-Tr8 of the selecting gate 24 conductive when the internal test mode instructing signal is applied. The reading gate 36 transmits the output of the logic operation circuit 34 to the output buffer 38 in response to the internal test instructing signal from the test control circuit 40.

In the foregoing configuration, the configuration in the memory cell array comprises the folded bit lines, so that all the complementary data are transmitted in pair onto the signal lines transmitting the internal data. Therefore, the bit line BL is connected to the input/output data line I/O, while the complementary bit line $\overline{BL}$ is connected to the complementary input/output data line $\overline{I/O}$ in each of the memory cell array blocks 10a-10d. Similarly, the internal data line DB is connected to the data input/output line I/O, while the complementary internal data line $\overline{DB}$ is connected to the complementary internal data input/output line $\overline{I/O}$.

Next, the operation of this semiconductor memory device will be briefly described with reference to FIG. 1. First of all, an operation mode for carrying out the data input/output in the common 1-bit unit will be described.

In a dynamic random access memory, a row address and a column address are generally supplied in a time-division multiplexing manner to address input terminals (which are A0-A9 in FIG. 1). The row and column addresses provided in a time-division multiplexing manner are respectively accepted at the falling edges of the row address strobe signal $\overline{RAS}$ and the column address strobe signal $\overline{CAS}$ under control of the RAS buffer 42 and the CAS buffer 46, so that the internal row address signals RA0-RA9 and the internal column address signals CA0-CA9 are generated. 9-bit internal row address signals RA0-RA8 out of 10-bit internal row address signals RA0-RA9 generated from the address buffer 14 are supplied to the row decoders 16a-16d. The row decoders 16a-16d decode these supply internal row address signals RA0-RA8 to select corresponding word lines. After stabilization of the word line selecting operation of the row decoders 16a-16d, a word line driving signal WL is generated by the word driver 18 to be transmitted onto a selected word line, whereby the selected word line is activated. As a result, information stored in memory cells MC connected to the selected word line is transmitted onto a bit line BL (or $\overline{BL}$). The potential on the bit line BL (or $\overline{BL}$) in a pair slightly changes according to the read-out information, while the potential on the other bit line $\overline{BL}$ (or BL) of the pair does not change, so that a potential difference occurs on the bit line pair BL, $\overline{BL}$. The sense amplifiers 12a-12d are then activated in response to the sense amplifier activating signal from the sense amplifier control circuit 44, so that the potential difference on each of the bit line pairs is amplified. A unit column decoder of the column decoders 20a-20d is selected by the internal column address signals CA0-CA8, and its corresponding bit line pair BL, $\overline{BL}$ is connected to the data input/output lines I/O, $\overline{I/O}$. According to a series of operations described above, in the data reading operation, the data of a 1-bit memory cell MC in the respective memory cell array blocks 10a-10d is transmitted onto the respective data input/output lines I/O1, $\overline{I/O1}$-I/O4, $\overline{I/O4}$ and then to the respective preamplifiers 26a-26d. The preamplifiers 26a-26d further amplify received information. The most significant address bits RA9, CA9 of the internal address signals generated from the address buffer are supplied to the nibble decoder 29. The nibble decoder 29 selects only one of four outputs thereof in response to these most significant internal address signals RA9, CA9 to apply a selecting signal to the selecting gate 24. Accordingly, only one pair of the transistors Tr1-Tr8 included in the selecting gate 24 is turned on, so that the preamplifier output connected to this transistor pair is transmitted onto the internal data lines DB, $\overline{DB}$. In a normal operation mode in 1-bit unit or in a rapid serial access mode such as a nibble mode, a test mode instructing signal TE is not generated, and the test control circuit 40 controls the reading gate 36 and connects the output buffer 38 to the internal data lines DB, $\overline{DB}$. Therefore, the complementary data pair transmitted onto the internal data lines DB, $\overline{DB}$ is sent to the output buffer 38 and is output as the read-out data Dout from the output buffer 38 after translated into 1-bit data.

A write control signal $\overline{W}$ is logical high (the "H" level) in the above described data reading operation, whereby the writing gate 32 is non-conductive and the external input buffer 28 is not connected to the internal data lines DB, $\overline{DB}$.

In the data writing operation, the external write control signal $\overline{W}$ is logical low (the "L" level) and the input buffer 28 is activated, and therefore the writing gate 32 is rendered conductive. Accordingly, a complementary input data pair Din, $\overline{Din}$ corresponding to write-in data Din generated by the input buffer 28 is transmitted onto the internal data lines DB, $\overline{DB}$. The complementary data pair transmitted onto the internal data lines DB, $\overline{DB}$ is transmitted to a selected memory cell through the opposite path to the one in the above described data reading operation, and thus input data are written. The foregoing description is a summary of the data reading/writing operations in one memory cycle.

In a nibble operation mode as well as in a normal mode, a 1-bit memory cell (precisely one preamplifier) is first selected by the nibble decoder 22 responsive to the internal addresses RA9, CA9, and data is written in or read from the selected memory cell via the preamplifier selected by the nibble decoder 22. By sequentially toggling an external column address strobe signal $\overline{CAS}$ with a signal $\overline{RAS}$ kept at an active state, i.e., the "L" level, the nibble decoder 22 sequentially turns on the transfer gate transistor pairs in the selecting gate 24 in response to the toggle, thereby connecting the preamplifiers 26a-26d to the internal data lines DB, $\overline{DB}$ sequentially. Although the preamplifiers 26a-26d and the memory cell array blocks 10a-10d simultaneously transmit data, memory cells are sequentially accessed bit-by-bit from the memory cell array blocks 10a-10d so as to write or read the data of the memory cells when seen from the outside of the memory device, In a functional testing mode operation in the semiconductor memory device, a test mode instructing signal TE is generated and all the transfer gate transistors Tr1-Tr8 in the selecting gate 24 are turned on by the nibble decoder 22 under the control of the test control circuit 40. Furthermore, the reading gate 36 connects the logic operation circuit 34 to the output buffer 38. In this functional testing mode, the complementary internal write-in data Din, $\overline{Din}$ received via the input buffer 28 are simultaneously transmitted to the memory cells selected in the four memory cell array blocks 10a-10d and are written therein, while in data reading, 4-bit memory cell data are sent to the logic operation circuit 34 via the preamplifiers 26a-26d. The logic operation circuit 34 receives the 4-bit data (precisely 8-bit data to be a complementary data pair) and, after performing a predetermined logic operation, outputs the data indicating a logic operation result thereof. The output buffer 38 receives the output of the logic operation circuit 34 output via the reading gate 36 to output the corresponding read-cut data Dout.

The foregoing description is a summary of the data reading/writing operations in one test cycle and hereinafter such operations will be described in further detail in conjunction with the configuration of a memory cell array portion.

FIG. 2 is diagram illustrating in more detail a major portion of one memory cell array block in the semiconductor memory device shown in FIG. 1. The configuration in FIG. 2 comprises memory cell array corresponding to 256K bit, sense amplifiers, and data input/output lines I/O, $\overline{I/O}$. In FIG. 2, there are provided 512 word lines WL1-WL512, and 512 pairs of bit lines BL1, BL1--BL512, $\overline{BL}$512 intersecting the 512 word lines WL1-WL512. A memory cell MC1 is provided at the intersection of a word lines WL1 and a bit line BL1, and a memory cell MC2 is provided at the intersection of a word line WL2 and a complementary bit line $\overline{BL1}$. Similarly, a memory cell MC511 is provided at the intersection of a word line WL511 and the bit line BL1, while a memory cell MC512 is provided at the intersection of a word line WL512 and the complementary bit line $\overline{BL1}$. That is, a folded bit line scheme is given in which one memory cell is provided at the intersection of one word line and either one bit line of a bit line pair, and a total of 512 memory cells are provided for 1 bit line pair. Each memory cell MC (which typically illustrates a memory cell) comprises a capacitor C0 for storing information in the form of a charge, and a transfer gate transistor Q0 which is turned on responsive to a word line potential to connect the capacitor C0 to its corresponding bit line BL (or $\overline{BL}$). The transfer gate transistor Q0 is formed employing, for example, an n channel MOS transistor. The memory cell capacitor C0 is of, for example, a MOS (metal-insulation film-semiconductor) structure. One electrode of the memory cell capacitor C0 is connected to a power supply which outputs a predetermined constant voltage Vcp (for example, a ½ value of an operation supply voltage Vcc) developed on a semiconductor chip where the semiconductor memory device is provided.

A sense amplifier 2 is provided for each bit line pair BL, $\overline{BL}$ to sense and amplify a potential difference on the bit line pair. The sense amplifier 2 comprises a p MOS sense amplifier portion of a flip-flop type configuration comprising p channel MOS transistors Q3, Q4, and a nMOS sense amplifier portion of a flip-flop type comprising n channel MOS transistors Q1, Q2. A node N1 of the nMOS sense amplifier portion is connected to a signal line SN. A node N2 of the pMOS sense amplifier portion is connected to a signal line SP. The transistors Q1, Q2 have their gates and drains cross-coupled to each other and their sources connected to the signal line SN. Similarly, the transistors Q3, Q4 have their gates and drains cross-coupled to each other and their sources connected to the signal line SP.

A sense amplifier activating circuit 6 is provided for activating the sense amplifiers 2. The sense amplifier activating circuit 6 comprises an n channel MOS transistor Q10 which is turned on responsive to a sense amplifier activating signal S0 to connect the signal line SN to the ground potential level, and a p channel MOS transistor Q11 which is turned on responsive to a sense amplifier activating signal $\overline{S0}$ to connect the signal line SP to the operation supply potential Vcc level. Therefore, in activation of the sense amplifiers 2, the nMOS sense amplifier portion discharges the potential on a lower potential bit line of a corresponding bit line pair to the ground potential, while the pMOS sense amplifier portion charges the potential on a higher potential bit line of a corresponding bit line pair to the operation supply potential Vcc level.

An equalizing/holding circuit 4 is provided for maintaining the potential of each bit line pair at a prescribed potential $V_{BL}$ in a standby period. The equalizing/holding circuit 4 comprises an n channel MOS transistor Q8 which is turned on responsive to an equalizing signal EQ to connect the bit line BLI to a signal line $L_{BL}$, an n channel MOS transistor Q9 which is turned on responsive to the equalizing signal EQ to connect the complementary bit line BL1 to the signal line $L_{BL}$, and an n channel MOS transistor Q7 which is turned on responsive to the equalizing signal EQ to inter connect the bit lines BL1, BL1. A holding voltage $V_{BL}$ is developed on the semiconductor chip where the semiconductor memory device is provided, in order to maintain the equalizing voltage level on each bit line (for example Vcc/2) when a row address strobe signal $\overline{RAS}$ externally provided is in the "H" level (i.e. the standby state).

An I/O gate 3 is provided for connecting a corresponding bit line pair to the data input/output lines I/O, I/O responsive to an external column address. The I/O gate 3 comprises an n channel MOS transistor Q5 which is turned on responsive to a column decoder output Y (column selecting signals Y1-Y512 are typically illustrated) to connect the bit line BL1 to the data input/output line I/O, and an n channel MOS transistor Q6 which is turned on responsive to the column selecting signal Y to connect the complementary bit line BL1 to the complementary data input/output line I/O.

A block 5 shown by a chain dotted line in FIG. 2 illustrates a 512-bit cell array including memory cells MC connected to one bit line pair, a sense amplifier 2, an equalizing/holding circuit 4 and an I/O gate 3. In the 256K bit memory cell array, 512 blocks 5 are arranged in parallel, and 512 unit column decoders are arranged corresponding to the 512 blocks 5. 256K bits now represent 262, 144 bits. Next, a one-cycle operation in the memory cell array block shown in FIG. 2 will be described with reference to a timing chart thereof in FIG. 3.

An equalizing signal EQ is almost synchronized with the row address strobe signal $\overline{RAS}$ externally provided and is at the "H" level before the time t1. Such state corresponds to the state that the row address strobe signal $\overline{RAS}$ is in the "H" level, i.e. the standby state of the semiconductor memory device. In this state, all the transistors Q7-Q9 in the equalizing/holding circuit 4 are on, and the potentials of the bit line pair BL, $\overline{BL}$ are equally Vcc/2. This precharging (or equalizing) potential is basically achieved by the fact that in the preceding operation cycle, one of the bit line BL and complementary bit line $\overline{BL}$ is at the operational supply potential Vcc while the other bit line is at the ground potential, and the equalizing transistor Q7 is rendered conductive at the end of the cycle. Therefore, the potential Vcc/2 need not be supplied from a supply potential VBL for holding. However, if the standby state lasts long, the holding potential $V_{BL}$ is supplied to each bit line BL, $\overline{BL}$ via the transistors Q8, Q9 in order to prevent the fluctuation of the equalizing/holding potential due to some noise. That is, the potential $V_{BL}$ is the supply potential for maintaining the bit line potential at a constant value.

First of all, a reading operation will be described. When the row address strobe signal $\overline{RAS}$ goes to the "L" level and the equalizing signal EQ goes to the "L" level as well, near the time t1, the transistors Q7-Q9 in the equalizing/holding circuit 4 are turned off, and bit line pairs BLi, $\overline{BLi}$ (i=1-512) are made to be in an electrically floating state. At this time, an external address is accepted into the memory device at the falling edge of the row address strobe signal $\overline{RAS}$ and is supplied to the row decoders as described above. As a result, one unit decoder out of the row decoders is selected.

When the word line driving signal WL is activated to rise to the "H" level at the time t2, one of the 512 word lines WL1-WL512, connected to the selected unit row decoder is selected, so that the potential thereof attains the "H" level. As shown in FIG. 2, there is provided a configuration in which one memory cell MC is selected for one word line in one block 5, and 512 memory cells for 512 bit line pairs are connected to this selected word line. Therefore, 512 memory cells are selected according to the selection of one word line. As a result, a charge stored in each of the selected memory cells is transmitted onto the bit line BL or $\overline{BL}$. Since the ratio of a capacitance value C0' of the memory cell capacitor C0 to a capacitance value $C_{BL}$ of a bit line is normally and approximately 1:10, a change in the potential on the bit line by the read-out memory cell data is small and approximately 1/10 of the operational supply potential Vcc. If the selected memory cell stores the "H" level and is connected to the bit line BL1, the potential of the bit line BL1 slight by rises as shown by the solid line in an operation waveform diagram of FIG. 3. On the other hand, the potential of the complementary bit line $\overline{BL}$ remains at $V_{cc/2}$ because a selected memory cell does not exist thereon.

When the sense amplifier activating signal S0 goes to the "H" level while the sense amplifier activating signal S0 goes to the "L" level at the time t3, the common source line (signal line) SN goes to the "L" level while the signal line SP attains the "H" level, so that the n MOS sense amplifier comprising the transistors Q1, Q2 and the pMOS sense amplifier comprising the transistors Q3, Q4 are activated so as to amplify the potential of the bit line BL1 to the "H" level and the potential of the complementary bit line BL1 to the "L" level. At this time, the potentials of the 512 bit line pairs are respectively changed to the "H" level or the "L" level by 512 sets of the sense amplifiers depending on information of the respective 512 memory cells selected.

When an internal column address is supplied to column decoders, and one unit column decoder included in the column decoders is selected, and therefore the output Yi thereof (Y1 in FIG. 3) attains the "H" level at the time t4, one of the 512 bit line pairs (BL1, BL1 in FIG. 3) is connected to the data input/output lines I/O, I/O via an I/O gate 3. As a result, the potential levels of the data input/output lines I/O, I/O already maintained at an electrically floating state, respectively change to the "H" level and the "L" level according to the levels of the bit lines connected thereto. After that, as mentioned above, the read-out data are further amplified in a pre-amplifier connected to the data input/output lines I/O, I/O, and they are supplied to the output buffer to be output as the output data Dout of the "H" level via this output buffer.

When the potential of the word line selected goes to the "L" level at the time t5 (FIG. 3 shows the state in which the word line WL1 is selected), the selected memory cells and the bit line BL (or $\overline{BL}$) are electrically separated.

When the sense amplifier activating signals S0, $\overline{S0}$ respectively goes to the "L" level and the "H" level, and the equalizing signal EQ attains the "H" level at the time t6, the bit line pair BL, $\overline{BL}$ are respectively equalized, so that the potentials thereon attains the level of Vcc/2 to be the standby state for the subsequent cycle. Accordingly, one memory cycle (operation cycle) is completed.

The potential level on the bit line BL (or $\overline{BL}$) amplified during the time t3 to t5 is transmitted to the selected memory cells, so that this potential level is re-written into the selected memory cells. If the selected memory cell stores the "L" level, changes of signals shown by the dashed line in FIG. 3 are provided for the bit lines, and the read-out data from the data output buffer goes to the "L" level.

Next in the writing operation, if the level of the data input/output lines I/O, $\overline{I/O}$ is previously set to the "H" level or the "L" level not to the floating state, according to the value of the write-in data Din, the data input/output lines I/O, $\overline{I/O}$ and the selected one bit line pair are connected to each other at the time t4, so that the potential on the bit line pair selected attains the potential level corresponding to the write-in data, and this potential level is also written in the selected memory cell.

Note that the bit line BL is connected to the data input/output line I/O and the complementary bit line $\overline{BL}$ to the complementary data input/output line $\overline{I/O}$ in the above mentioned configuration. Therefore, for the memory cell connected to the complementary bit line $\overline{BL}$ paired with the bit line BL (for example, the memory cell connected to the word line WL2), an opposite value to the write-in data Din (for example, the "L" level as opposed to the "H" level) is written, and further even in data reading as for this memory cell, an opposite data value to the potential level written in this memory cell is output as the read-out data Dout from the output buffer. In this case, the data opposite in value to the external write-in data is written in the memory cell and the data opposite in value to that stored is read out as a read-out data in data reading. Thus, if seen from the outside of the semiconductor device, it means that the write-in data is read out as it is, and therefore no problem arises therein.

The central feature of the present invention is that at least one less than all memory cells selected simultaneously is connected to the data input/output buses I/O, $\overline{I/O}$ in a different manner from that of the remaining cells.

Furthermore, in a common semiconductor memory device, each of the memory cell array blocks is of the same configuration, so that only the memory cells connected to the bit line BL or the memory cells connected to the complementary bit line $\overline{BL}$ are selected simultaneously from each of the array blocks.

Next, the operation of the semiconductor memory device in a test mode will be described with reference to FIG. 1. In this case, the test mode instructing signal TE attains the "H" level to be applied to the test control circuit 40. The test mode control circuit 40 controls the nibble decoder 22 and makes all the outputs of the nibble decoder 22 be at the "H" level simultaneously, regardless of the values of the internal row address signal RA9 and the internal column address signal CA9. As a result, the transistors Tr1-Tr8 in the selecting gate 24 are all rendered conductive. In data writing, the data transmitted to the selecting gate 24 are all simultaneously transmitted to the respective memory cells of a total of 4 bits selected in the memory cell array blocks 10a-10d, respectively, and therefore the same data are written in the memory cells of 4 bits as well as in the previously described operation. Accordingly, the required time for data writing is reduced to ¼ that of the scheme in which the data are written into the memory cells in 1-bit unit.

In data reading, the test control circuit 40 makes the reading gate 36 connect the output of the logic operation circuit 34 to the output buffer 38 in response to the signal TE. The 4-bit data read out in the same way as in the previously described reading operation are transmitted to the preamplifiers 26a-26d simultaneously. The 4-bit memory cell information is then transmitted to the logic operation circuit 34 to undergo logic operation process, and then sent to the output buffer 38 via the reading gate 36. The output buffer 38 amplifies the output of the logic operation circuit 34 and outputs the read-out data Dout corresponding to the result of this logic operation processing. Accordingly, the required time for data reading is reduced to ¼ the required time for the scheme for accessing the memory cells in 1 bit unit to carry out functional testing. As mentioned heretofore, the test time in this test mode can be simply reduced to ¼ the time in the conventional 1 bit unit scheme.

In the above mentioned prior art, a circuit configuration which is shown simplified in FIG. 4A and gives truth values shown in FIG. 4B, is employed as this logic operation circuit 34. Referring to FIG. 4A, the logic operation circuit 34 comprises an AND gate AN1 for receiving 4-bit memory cell data M0-M3 and an AND gate AN2 for receiving the inverted data of the 4-bit memory cell data $\overline{M0}$-$\overline{M3}$. The output buffer 38 comprises an n channel MOS transistor TR1 connected to an operational supply potential Vcc, and an n channel MOS transistor TR2 connected to a ground potential. The output of the AND gate AN1 is supplied to the gate of the transistor TR1, while the output of the AND gate AN2 is supplied to the gate of the transistor TR2. Read-out data Dout are output from the connecting point of the transistors Tr1 and Tr2. In the reconfiguration of FIG. 4A, the read-out data M0-M3 correspond to the data transmitted via the data input/output lines I/O1-I/O4, while the data $\overline{M0}$-$\overline{M3}$ correspond to the data transmitted via the input/output data lines $\overline{I/O1}$-$\overline{I/O4}$. Further, in the truth table shown in FIG. 4B, the numeral "0" represents the case that a selected memory cell outputs the "L" level, while the numeral "1" represents the case that the selected memory cell outputs the "H" level. As clearly seen from the truth table shown in FIG. 4B, when the logic operation circuit shown in FIG. 4A is employed, if all the selected 4-bit memory cells output "0", the output data Dout are "0", while if all the read-out data are "1", the read-out data Dout are "1". Further, in case of the 4-bit read-out data with at least one bit different from the others, the output data Dout are at a high impedance (Hi-Z) state. This scheme is usually called a 3-value output scheme. As described above, since the same data are written in the 4-bit memory cells simultaneously, when the memory cells function normally, all the data outputted from the selected 4-bit memory cells are the same. Therefore, in this 3-value output scheme, the output data is not provided (the high impedance state) except when the memory cells function normally, so that detection of defects by a detecting device is easily carried out particularly upon unit testing (testing of a single device). In addition, even if all the selected 4-bit memory cells are defective, the data value thereof are output as they are, so that the output data can be easily seen and all the defective states can be detected by the detecting device.

Meanwhile, a 2-value output scheme which does not include this high impedance state is considered and proposed in the article entitled "A 90ns 4Mb DRAM in a 300mil DIP" by Mashiko et al in the IEEE; Digest of Technical Papers, 1987, pp. 12-13. This 2-value output scheme, of which the circuit configuration and truth table are shown in FIGS. 5A and 5B, respectively, is the scheme in which if all the 4-bit memory cells output the same data, "1" is output as the output data Dout, if even 1 bit of the memory cells is defective and its output data is different from those of others, "0" is output as the output data Dout. This scheme is about to be standardized in a 4 megabit DRAM.

FIG. 5A is a diagram illustrating one example of the simplified configuration of the logic operation circuit in this 2-value output scheme. FIG. 5B is a truth table showing its truth values. Referring to FIG. 5A, the logic operation circuit 34 of the 2-value output scheme 34 comprises an AND gate AN3 for receiving the outputs of 4 bit memory cell data M0-M3, an AND gate AN4 for receiving the inverted data of the 4-bit memory cell data M0-M3, an OR gate O1 for receiving the outputs of the AND gates AN3, AN4, and an inverter I1 for inverting the output of the OR gate O1. The output of the OR gate O1 is supplied to the gate of a transistor TR1 included in the output buffer 38, while the output of the inverter I1 is supplied to the gate of a transistor TR2 included in the output buffer 38.

As described above, the time required for the function test of the semiconductor memory device is reduced by simultaneously accessing the memory cells of a plurality of bits and carrying the functional testing of the memory cells in the unit of the plurality of bits; however, the following problems arise in the semiconductor memory device having a conventional test mode of 2-value output scheme. Assuming that all the 4-bit memory cells selected simultaneously are defective, for example, all the read-out data from the 4-bit memory cells are "0" although "1" is written in all the 4-bit memory cells, the output data Dout are "1" as shown in FIG. 5B, so that the semiconductor memory device is determined as good (pass).

When such defects in the memory cells are, for example, fixed defects such as a pattern defects which occur in manufacturing of the semiconductor memory device, the memory device having such defects can be removed by testing all the bits in advance according to a test in the normal mode (access in a 1-bit unit). As a matter of course, a benefit of reduction in the test time is lost in this case.

However, if the foregoing problem arises in a test for checking an operating margin such as a timing margin, a voltage margin etc., the functional testing cannot be carried out in the test mode. The timing margin is a margin indicating the tolerance of a deviation in the operation timing of a control signal in the device in which the semiconductor memory device can operate correctly. The voltage margin is, for example, a margin indicating an allowable fluctuation range of an operation supply voltage within which the semiconductor memory device normally operates. As an example of such function testing, a refresh margin test is reviewed.

As described above, in a memory cell of the DRAM, information is stored in a memory cell capacitor (MOS capacitor) in the binary form of "1" (corresponding to the "H" level) or "0" (corresponding to the "L" level). Particularly, the state in which "1" is stored and a written potential is the "H" level, which, by convention, corresponds to the depleted state where no electrons exist in a memory capacitor portion, is thermally nonequilibriated. In contrast, the "L" level is stable. Therefore, if this memory cell is maintained in a non-access state (a standby state) for a long period of time, electrons are collected in the depleted capacitor storing "H" level little by little such as by a junction leak (a leak through a junction portion between a semiconductor substrate and an impurity region providing for the capacitor portion), and information thereof changes to the "0" state. Accordingly, it is necessary to read the information of each memory cell to be rewritten in a predetermined period of time. This operation is usually called "refresh". The refresh margin test is the one for checking if a memory cell keeps correct information, e.g. how long a period from one refresh to the next refresh would be. In this refresh margin test, a defect occurs in the memory cell only when "1" is stored therein, so that no defect is seen in the memory cell storing "0" (the state in which electrons fill the memory capacitor). That is, only an error consisting of a "1" → "0" transition of the memory cell occurs in this refresh margin test. Problems which may occur in the refresh margin test will be described hereinafter in detail. For example, it is assumed that such a test is carried out that "1" is written in the memory cells of all the bits in the semiconductor memory device and is maintained in the standby state for a certain period of time (which is called a data holding time), and then is read out. If the data holding time is short, the data of each memory cell are correctly held, whereas if the data holding time is extremely long, there occurs an inversion of the memory cell data, resulting in a defect in the memory cell. Namely, the error consisting of "1"→"0" transition of the memory cell arises. However, when this test is carried out in the test mode of the 2-value output scheme, even if all the memory cells selected caused the error "1"→"0", all the outputs of the selected 4-bit memory cells coincide with each other. Accordingly, the output data Dout are "1" according to the truth table shown in FIG. 5B, so that the semiconductor memory device is determined as good.

Furthermore, problems which may occur in the voltage margin test will now be described with reference to FIGS. 6A and 6B. For example, a case is considered in which "1" is written in all the memory cells of the semiconductor memory device so as to carry out a test to read this write-in data with the operation supply voltage varied. In this case, it is necessary to check if the semiconductor memory device normally operates in the operation supply potential in a range of 4.5-5.5 V as guaranteed by specifications. It is assumed that there is a semiconductor memory device causing malfunctions at the operation supply potential below 4.75 V in the test in the normal mode (1-bit unit access) as shown in FIG. 6A. That is, it is simply assumed that the operating margin for "1" is small at the operation supply voltage below 4.75 V, and even if the data "1" are written in the memory cell, "0" is output from the memory cell. In a case that this semiconductor memory device is tested in the test mode of the 2-value output scheme, when the operation supply potential is greater than 4.75 V, each memory cell outputs the data of "1" if the data of "1" is written, so that the semiconductor memory device is determined as good as shown in FIG. 6B, and therefore no problem arises. However, when "1" is written in the memory cell with the operation supply potential less than 4.5 V, all the memory cells selected output "0", so that the output data Dout is "1" according to the truth table shown in FIG. 5B, and therefore this semiconductor device is determined as good. In FIG. 6B, a transition region is illustrated in an enlarged manner, which exists between one case in which all the memory cells are defective and the other case in which all the memory cells "pass" (namely, a region where some memory cells operate correctly, while the others are defective). However, this transition region does not exist in such an ideal state that all the memory cells are formed to be exactly the same.

In the actual checking of the semiconductor memory device when marketed, in order to reduce the testing time, the functional testing is not carried out many times with many variations in the operation supply voltage, typically, at least, it is carried out by using three or four points of the operation supply voltage, for example, 4.3 V or so. Therefore, there arises a problem that in this checking of the semiconductor memory device, the semiconductor memory device is determined as no good in the functional testing in the normal mode as shown in FIG. 6A, is determined as good as shown in FIG. 6B.

SUMMARY OF THE INVENTION

It is an object of the present invention to eliminate disadvantages in a semiconductor memory device operable in a conventional test mode, and to provide a semiconductor memory device comprising a functional testing mode capable of correct determination of acceptability of the semiconductor memory device.

It is another object of the present invention to provide a semiconductor memory device comprising an improved test mode of a 2-value output scheme.

It is a further object of the present invention to provide a test method of correctly detecting acceptability of a semiconductor memory device.

It is still further object to provide structure for enhancing circuitry for testing memory cells which is transparent to normal use.

A dynamic-type semiconductor memory device according to the present invention includes a test mode operation for carrying out function testing in a unit of a prescribed plurality number of memory cells, circuitry for simultaneously selecting the prescribed number of memory cells in this test mode, circuitry for receiving external write-in data, circuitry operatively coupled to the circuitry for receiving this write-in data for writing the data inverted from a value of the described write-in data in at least one, but less than all of the above prescribed number of memory cells selected, and writing the data of the same value as the value of the above described write-in data in the rest of the above prescribed number of memory cells selected, circuitry for making access to the above prescribed number of memory cells selected, inverting the stored data of the memory cells having the described inverted data written to read, and reading the stored data of the rest of the above prescribed number of memory cells selected, as they are, and circuitry for receiving the output of the above described reading circuitry in this test mode and outputting a logic value corresponding to this received output data.

A testing method of the semiconductor memory device according to the present invention comprises the steps of: selecting a plurality of memory cells, writing data inverted from write-in data in at least one of the plurality of memory cells selected and also writing the same data as the write-in data in the remaining memory cells selected, inverting the data in at least one of the plurality of selected memory cells where the inverted data are written, reading the data in the remaining memory cells of the above selected memory cells, and carrying out a predetermined logic operation to the read-out memory cell data of a plurality of bits to determine acceptability of this memory device.

In the dynamic-type semiconductor memory device in accordance with the present invention, the data inverted from the write-in data are written in at least one of the prescribed number of memory cells selected simultaneously, and the write-in data are written, as they are in the remaining memory cells, and in reading, the data of the memory cell or cells where the inverted data are written are inverted, and the remaining memory cell data are read as they are. Therefore, the plurality of memory cells selected simultaneously always include a memory cell for storing "1" and one for storing "0", and all the data of the memory cells selected simultaneously are not inverted. Furthermore, even if one selected memory cell is defective and information stored therein is inverted, information that the defective memory cell exist can be detected reliably, and hence correct function testing of the semiconductor memory device can be carried out in the unit of the plurality of bits.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram illustrating one example of the detailed configuration of this logic operation circuit.

FIG. 4B is a truth table illustrating the input/output relation thereof.

FIG. 5 is a diagram illustrating one example of the detailed configuration of the logic operation circuit thereof FIG. 5B is a truth table of the input/output thereof.

FIG. 6A is a graph typically illustrating a determination of acceptability of the semiconductor memory device in a normal mode of the function testing in a 1-bit unit.

FIG. 6B is a graph typically illustrating the determining operation of good/no good of the semiconductor memory device in a test mode for carrying out a test in a unit of a plurality of bits.

FIG. 7 is a block diagram illustrating the configuration of the dynamic-type semiconductor memory device of one embodiment of the present invention.

DESCRIPTION OF THE PREFERRED EMBODIMENTS

Figure 1:
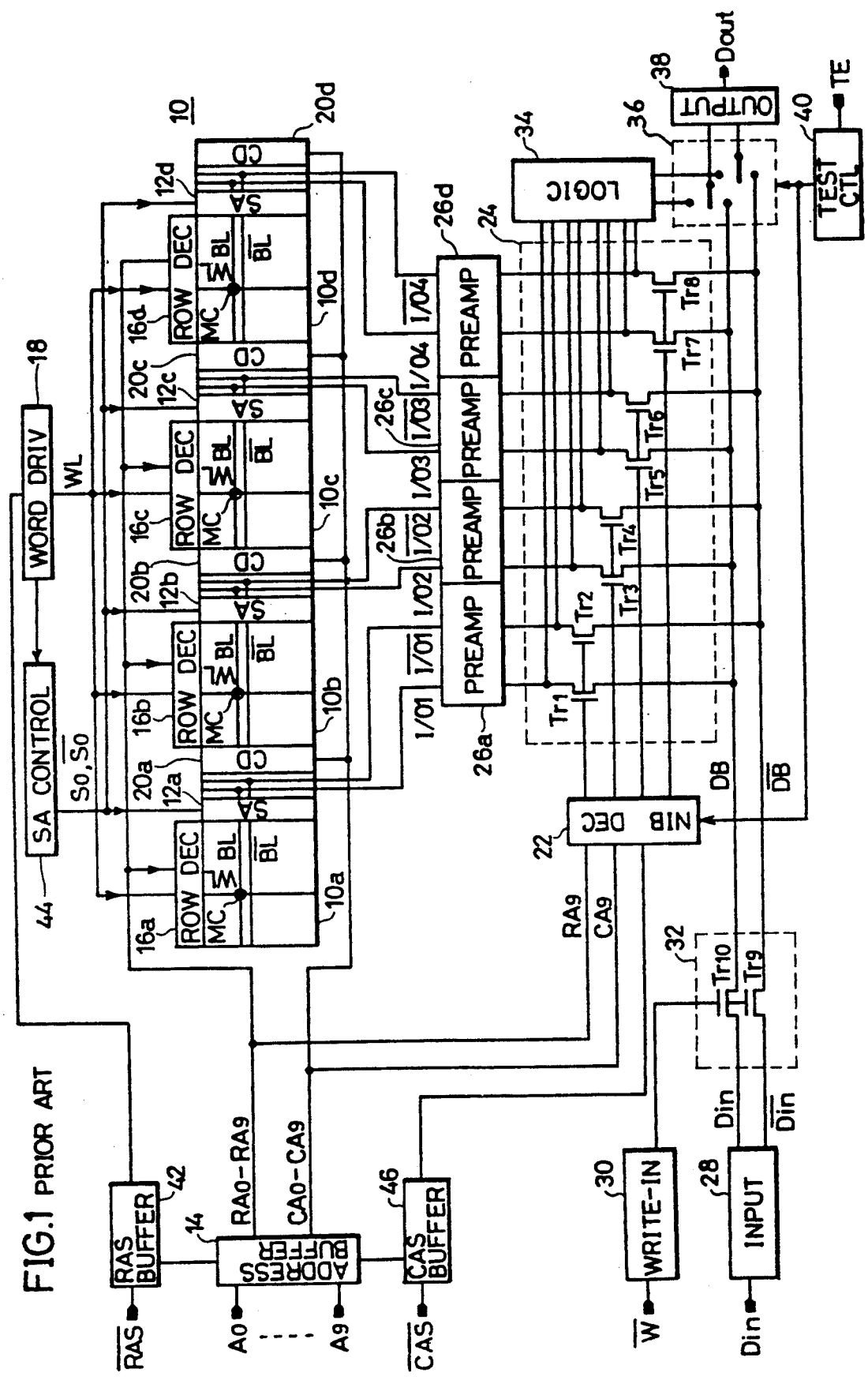
FIG. 1 is a block diagram illustrating the entire configuration of a conventional dynamic-type semiconductor memory device.

The configuration of a dynamic-type semiconductor memory device of one embodiment of the present invention will be described with reference to FIG. 7. The figure illustrates the configuration which corresponds to the configuration of the conventional 1 MDRAM in FIG. 1, and portions thereof corresponding to those in the semiconductor memory device of FIG. 1 are denoted with the same reference numerals. As apparently seen from FIGS. 7 and 1, in the dynamic-type semiconductor memory device, according to an embodiment of the present invention in FIG. 7, some of the memory cell array blocks 10a-10d are different from others in connection between a bit line pair BL, $\overline{BL}$ and its corresponding data input/output line I/O, $\overline{I/O}$ as shown by circles formed with broken lines 100a-100d. Namely, in each of the memory cell array blocks 10a, 10b, 10d, bit lines BL are connected to a data input/output line I/O, while complementary bit lines $\overline{BL}$ are connected to a complementary data input/output line $\overline{I/O}$. On the other hand, in the memory cell array block 10c, bit lines BL are connected to a complementary data input/output line $\overline{I/O3}$, while complementary bit lines $\overline{BL}$ are connected to a data input/output line I/O3. Each of the blocks 10a-10d has the same configuration of connection for all of the bit line pairs included therein.

That is to say, according to the present invention, when a memory cell selected is connected to the bit line BL, the same data as write-in data are written in the memory cell array blocks 10a, 10b and 10d, while a data value inverted from the value of the write-in data is written in the memory cell array block 10c.

An operation will now be described. First of all, the operation of writing data during function testing operation will be described. In this case, memory cells arranged in the same location in each of the memory cell blocks 10a-10d are selected by the nibble decoder 22 and the test control circuit 40. Assuming that write-in data Din into the input buffer 28 is "1", the complementary data of "1" and "0" are transmitted onto internal data lines DB, $\overline{DB}$. This complementary data pair is respectively transmitted onto the data input/output lines I/O1, $\overline{I/O1}$-I/O4, $\overline{I/O4}$ via preamplifiers 26a-26d. Furthermore, assuming that a memory cell to be connected to a bit line BL is selected in each of the memory cell array blocks 10a-10d, "1" is written in the selected memory cell in each of the memory cell array blocks 10a, 10b, 10d while the data of "0" is written in the selected memory cell in the memory cell array block 10c. That is, in each of the memory cell array blocks 10a, 10b, 10d, the data of "1" are transmitted onto the bit line BL, and the data of "0" are transmitted onto the complementary bit line $\overline{BL}$ via the data input/output lines I/O1, $\overline{I/O1}$, I/O2, $\overline{I/O2}$, I/O4, $\overline{I/O4}$, respectively. On the other hand, in the memory cell array blocks 10c, the data of "0" are transmitted onto the bit line BL, and a signal of the "1" level is transmitted onto the complementary bit line $\overline{BL}$ because the connection thereof is changed over. As a result, the data of "1" are written in the selected memory cell in each of the memory cell array blocks 10a, 10b, 10d while the data of "0" are written in the selected memory cell in the memory cell array block 10c. Now, write-in information M0-M3 into the selected memory cells is assumed to be expressed as (1101).

Such a case is considered in the above described refresh margin test that a memory cell is defective and the data of "1" changes to "0". Even in this case, the data remains "0" in the memory cell where "0" is written. Now, assuming that an error of the data "1"43 "0" occurs in all the memory cells, the data stored in each of the memory cells are (0000). Next, when the memory cells of 4 bits are simultaneously read in data reading, memory cell information in the memory cell array block 10c is inverted to be read, so that the data transmitted onto the data input/output lines I/O1-I/O4 are (0010). The data are sent to a logic operation circuit 34 via the preamplifiers 26a-26d. Therefore, the data of the selected memory cells of 4-bits are not identical to each other in the logic operation circuit 34, so that this semiconductor memory device is determined to be defective. That is, when the error "1"→"0" occurs in the refresh mode, the device is not determined to be defective in a conventional test mode of 2-value output scheme; however, the memory cell data of 4 bits are not identical to each other, so that the device is correctly decided to be defective in one embodiment of the present invention.

Also in a semiconductor memory device which in testing of a power supply voltage margin has a small margin for "1" at a low power voltage, "0" is written in at least one of the memory cells even if the write-in data Din are "1". Accordingly, even if inversion of the data of "1"→"0" due to a small operation supply voltage margin occurs in the rest of the memory cells, and the stored data in the selected memory cells of 4 bits change to (0000), they are (0010) in the data reading. Thus, the memory cell data of 4 bits are not identical to each other, so that the device is determined to be defective.

Moreover, in a case that the memory cells connected to the complementary bit lines $\overline{BL}$ are selected in the foregoing configuration, when write-in data Din are "1", the inverted data are written in each of the memory cells in a conventional device, whereas the data having the same value as that of the write-in data are written in one selected memory cell in the embodiment of the present invention. Accordingly, defects in the semiconductor device can be detected correctly as well as the above. That is to say, in the case that the write-in data Din are "1", and the selected memory cells are connected to the complementary bit lines $\overline{BL}$, the stored data of the selected memory cells of 4 bits are (0010). In this case, even if the data of "1" is inverted to "0" and the stored data of 4 bits change to (0000), the memory cell data of 4 bits are (1101) in data reading, so that the memory cell data of 4 bits are not identical to each other, resulting in correct detection of defects in the device.

In the above mentioned embodiment, for the bit lines BL, the data differing from the write-in data are written in only the 1-bit memory cell of the selected memory cells. However, another configuration alternative to this configuration can achieve the same effect as in the above mentioned embodiment; namely, as for the bit lines BL, the data inverted from the write-in data Din are written in a plurality of bits out of the memory cells simultaneously selected in the test mode, and the data with the same value as that of the write-in data are written in the rest of the memory cells.

Furthermore, in the above mentioned embodiment, such a case is described that the semiconductor memory device has the configuration of 1 MbDRAM, and four of the memory cells are simultaneously selected. However, the same effect as in the above mentioned embodiment can be achieved in other cases where more than or less than four of the memory cells are selected simultaneously in the test mode.

In addition, in the above mentioned embodiment, such a case is described that the memory cells selected simultaneously in the test mode are selected one from each of the memory cell array blocks; however, the memory cells of a plurality of bits may be simultaneously selected from any memory cell array block.

Further, the above mentioned embodiment has the configuration that at least one of the blocks has a different connection between a bit line pair and data input/output lines I/O, I/O; however, another configuration can achieve the same effect as in the above mentioned embodiment; namely, connection paths between the data buses DB, $\overline{DB}$ and the data input/output lines I/O, I/O are switched over for at least one of the blocks in the preamplifiers 26a-26d.

Further, it is described in the above mentioned embodiment that the memory cells simultaneously selected are the ones connected to either the bit lines BL or the complementary bit lines $\overline{BL}$; however, by a configuration in which at least one memory cell connected to the complementary bit line $\overline{BL}$ and the other memory cell connected to the bit line BL out of the memory cells that are simultaneously selected, achieves the same effect as in the above mentioned embodiment without switching over the connection between the bit lines and the data input/output buses.

The present invention is also applicable to a memory device having the test mode of a 3-value output scheme.

In the above mentioned embodiment, the case is described that a test mode instructing signal TE is applied via external terminals. However, this test mode instructing signal TE may be configured to generate an internal test directing signal when a specific timing relation is satisfied among external control signals, e.g. a row address strobe signal $\overline{RAS}$, a column address strobe signal $\overline{CAS}$ and a write signal $\overline{W}$, which is for example, a relation such as Write and $\overline{CAS}$ before $\overline{RAS}$ that the write signal is the "L" level, the signal $\overline{RAS}$ is the "H" level, and the signal $\overline{CAS}$ is the "L" level.

Furthermore, in the above mentioned embodiment, the configuration is described that a pair of internal data input/output lines I/O, I/O is connected to one memory cell array block; however, the present invention is not limited to this configuration, but also applicable to the configuration that a plurality of pairs of internal data input/output lines are connected to one memory cell array block.

Figure 2:
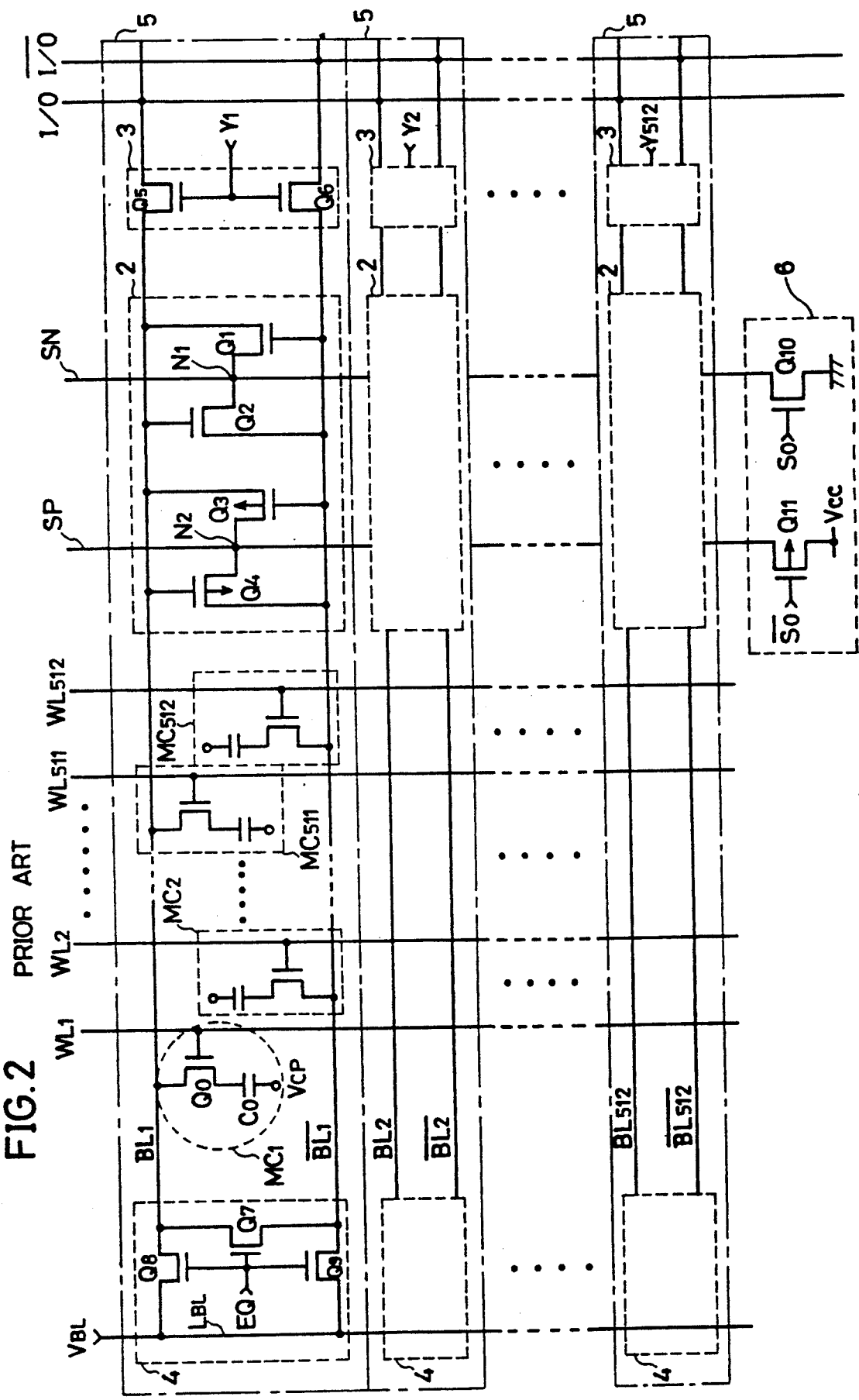
FIG. 2 is a diagram illustrating in detail the configuration of a major portion of a memory cell array portion in the conventional dynamic-type semiconductor memory device.
Figure 3:
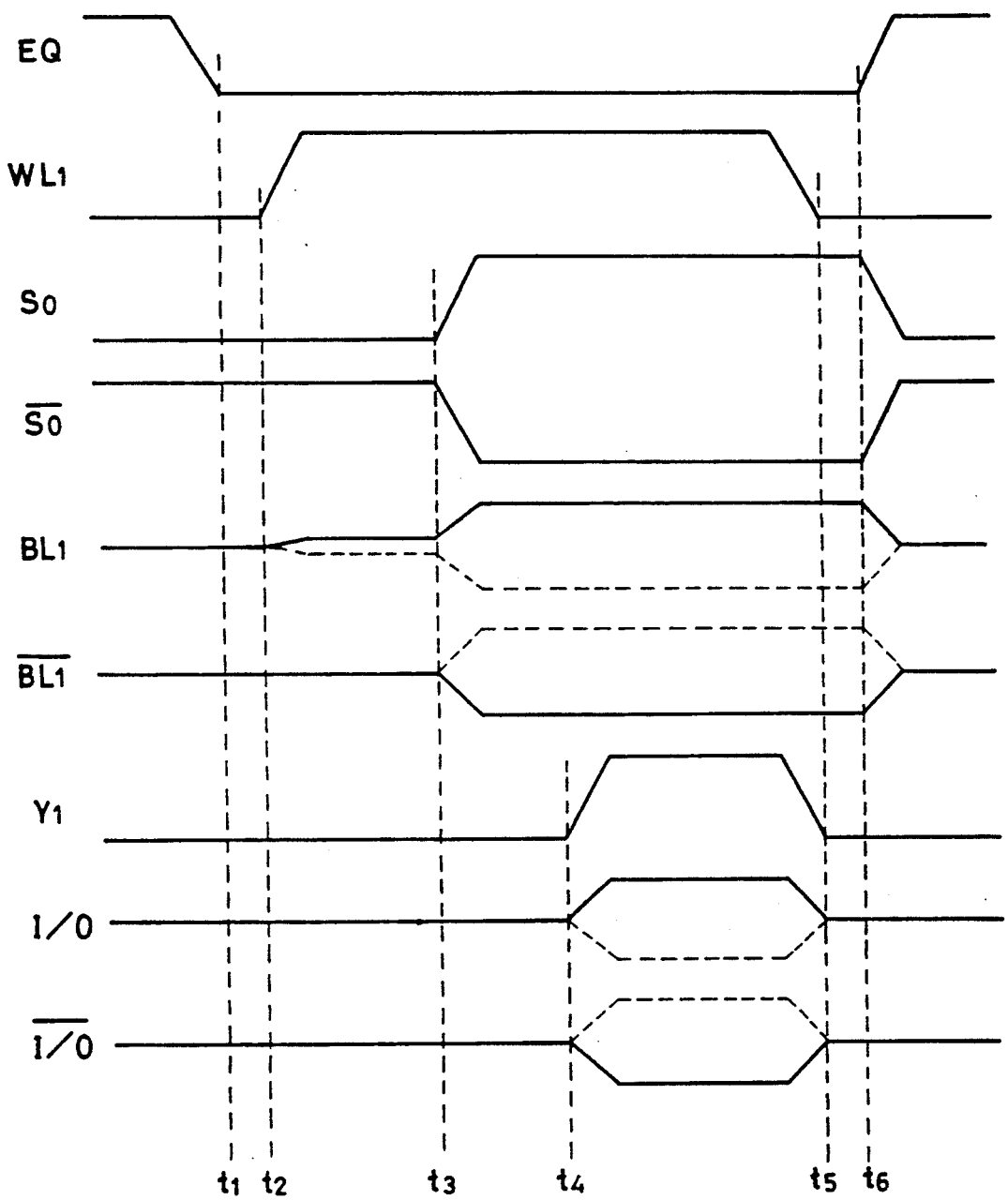
FIG. 3 is a waveform diagram illustrating the operation of the semiconductor memory device shown in FIG. 2.
Figures 4A, 4B:
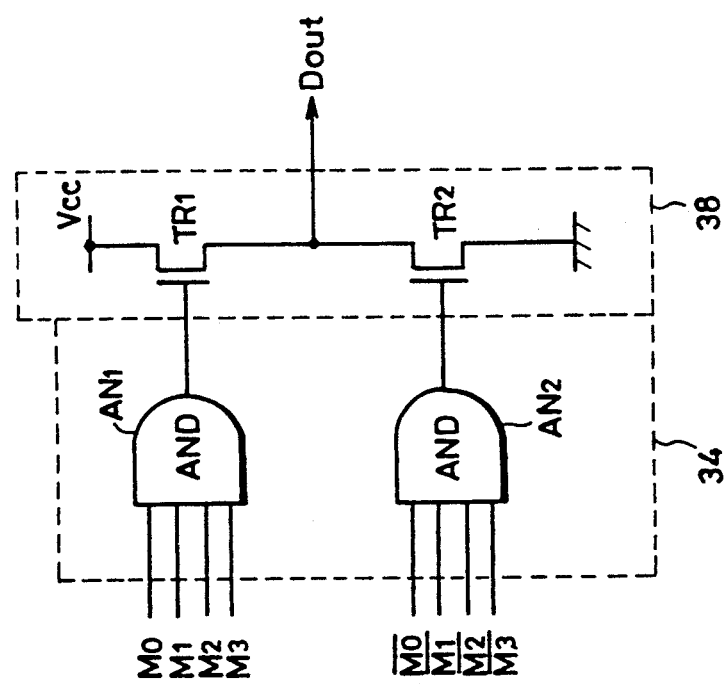
FIGS. 4A and 4B are a diagram illustrating the configuration of a logic operation circuit of a 3-value output scheme for simultaneously carrying out function test in dynamic-type semiconductor memory device for memory cells of a plurality of bits and a truth table thereof, respectively.
Figures 5A, 5B:
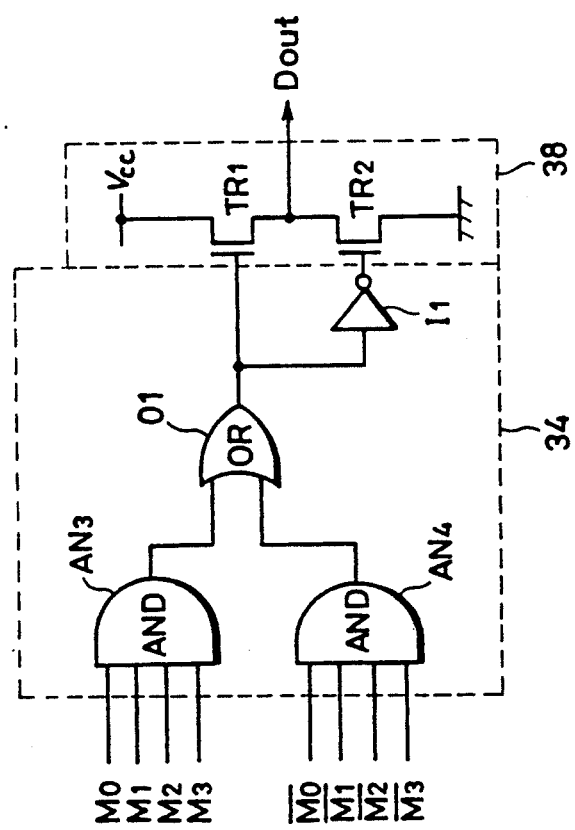
FIGS. 5A and 5B are a diagram illustrating the logic operation circuit in a 2-value output scheme of the dynamic-type semiconductor memory device and a truth table of the input/output thereof, respectively.
Figure 6A:
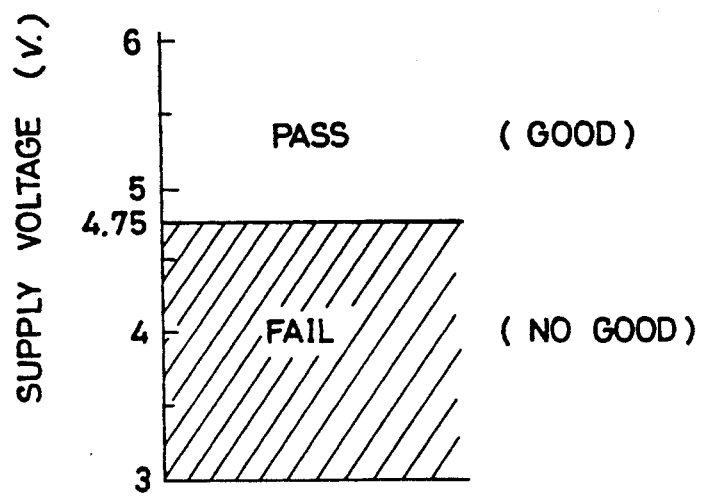
FIGS. 6A and 6B are graphs for describing problems of a supply voltage margin test in the semiconductor memory device comprising the conventional test mode of the 2-value output scheme.
Figure 6B:
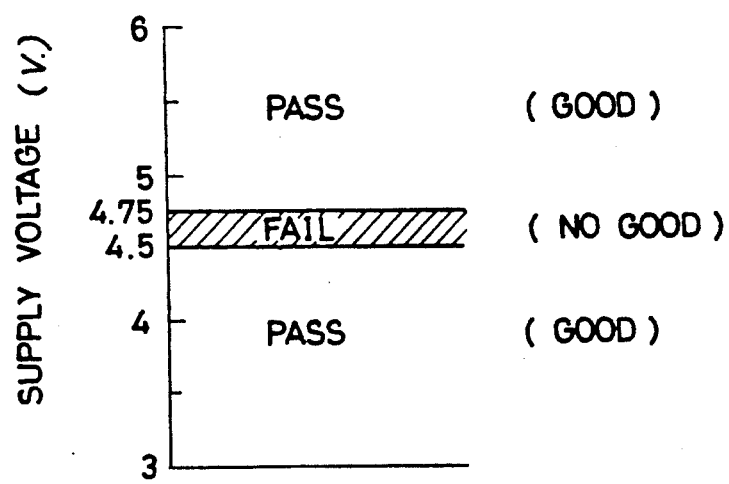

Further, such a configuration is described in the above mentioned embodiment that the bit lines BL and the complementary bit lines $\overline{BL}$ are arranged in order in each of the memory cell array blocks, e.g. from top to bottom in FIG. 2. However, the arrangement of the bit lines is not limited to this, but the present invention is also applicable to such arrangement of the bit lines having the bit lines BL and the complementary bit lines $\overline{BL}$ arranged in such sequence as BL, $\overline{BL}$, $\overline{BL}$ BL, so that the same effect as in the above mentioned embodiment can be achieved.

Moreover, in the above mentioned embodiment, the read-out data and the write-in data are transmitted via the data input/output lines I/O, I/O, however, the same effect can be achieved even in the configuration that the data input lines for transmitting the write-in data and the data output lines for transmitting the read-out data are provided separately.

As has been described heretofore, according to the present invention, such a configuration is provided that in data writing, into at least one of the prescribed number of memory cells simultaneously selected in the test mode is written the data which is the inversion of the value of the write-in data, and into the rest of the memory cells are written the data with the same value as that of the write-in data, while in data reading, information in the memory cell where the inverted data are written is inverted to be read, and information in the rest of the memory cells is read as it is. Therefore, even if data inversion of "1"→"0" occurs, such occurrence of the data inversion can be detected reliably, and therefore the dynamic-type semiconductor memory device having an improved test mode with a high capability of detecting defects can be implemented. That is to say, according to the present invention, the dynamic-type semiconductor memory device having the improved test mode of the 2-value output scheme with a high capability of detecting defects can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic-type semiconductor memory device including a memory cell array having a plurality of memory cells, each of said cells storing information therein, and operable in a test mode operation for simultaneously selecting a prescribed number of the memory cells in said memory cell array, simultaneously writing information in said prescribed number of memory cells selected, and then simultaneously reading information stored in said prescribed number of memory cells, and determining acceptability of said semiconductor memory device according to the information read out, said device comprising:

generating means for generating an internal test mode signal designating said test mode, selecting means activated in response to said test mode signal for simultaneously selecting said prescribed number of memory cells from said memory cell array in accordance with an address externally provided, receiving means for receiving write-in data externally applied, writing means coupled to said receiving means for writing a data value inverted from the value of said write-in data in at least one but not all memory cells of said prescribed number of memory cells selected, and also writing data values having the same corresponding values as that of said write-in data in the remaining memory cells of said selected prescribed number of selected memory cells, accessing means for accessing said selected prescribed number of selected memory cells, said accessing means including reading means for inverting and reading the stored data value of said at least one memory cell where said inverted data value is written, and reading the stored data values of said remaining memory cells as they are, and logic means activated in response to said test mode signal for receiving all of the output data from said reading means and outputting a logic value corresponding to the data received, wherein said memory cell array comprises a plurality of bit line pairs, each of said plurality of bit line pairs having a first bit line to which a data value of a selected memory cell is transmitted, and a second bit line to which a data value complementary to the data value on said first bit line is transmitted, said writing means and said reading means comprise a plurality of internal data transmitting line pairs, the number of said plurality of internal data transmitting line pairs corresponding to the number of memory cells selected simultaneously, and connecting means for connecting each internal data transmitting line pair with corresponding bit line pairs, connection of the bit line pairs of accessed memory cells to at least one but not all internal data transmitting line pairs being the reverse of the connection of the bit line pairs of corresponding accessed memory cells to the remaining internal data transmitting line pairs.

2. A method of performing a functional testing of a dynamic-type semiconductor memory device comprising a memory cell array having a plurality of memory cells each storing information, the plurality of memory cells connected to a plurality of internal data transmitting line pairs through corresponding bit line pairs, the connection of the bit line pairs of corresponding memory cells to at least one internal data transmitting line pair being the reverse of the connection of the bit line pairs of corresponding memory cells to remaining internal data transmitting line pairs, said method comprising the steps of:

generating a test mode signal designating a functional test mode, simultaneously selecting from said memory cell array, a prescribed number of memory cells corresponding to an address externally applied, receiving external write-in data values, writing a data value inverted from the corresponding data value of said write-in data in at least one but not all of said prescribed number of memory cells selected, and writing data values having the same corresponding values as that of said write-in data in the remaining memory cells of said prescribed number of memory cells selected, in response to said test mode signal, accessing said prescribed number of memory cells selected, inverting and reading stored data of at least one memory cell in which said inverted data is written, and reading the stored data values of said remaining memory cells in non-inverted form, and outputting a logic value corresponding to the stored data read from said prescribed number of memory cells in response to a test mode instructing signal.

3. A method of performing a function testing of a dynamic-type semiconductor memory device in accordance with claim 2, wherein said memory cell array is divided into a plurality of subarray blocks, and said simultaneously selecting step includes a step of selecting a 1-bit memory cell from each of said subarray blocks.

4. A method in accordance with claim 2, wherein said outputting step includes the step of determining whether or not read-out data are the same as each other.

5. A dynamic-type semiconductor memory device including a plurality of memory cells arranged in a matrix of rows and columns means for selecting simultaneously a predetermined number of memory cells, in response to an externally applied address;

a plurality of complementary internal data transmission line pairs for transferring data to be written or to be read, said plurality of complementary internal data transmission line pairs being related in number to the number of simultaneously injected memory cells; and connecting means for connecting complementary bit line pairs of the predetermined number of simultaneously selected memory cells with respective complementary internal data transmission line pairs in response to said externally applied address, wherein the connection between the complementary bit line pair of at least one selected memory cell and the corresponding complementary internal data transmission line pair is the reverse of the connections between the complementary bit line pairs and pairs for the remaining selected memory cells.

6. A connection arrangement facilitating testing of a memory having a plurality of memory cells and in which during at least testing of said memory cells a group of memory cells are accessed as a unit for writing of data and accessed as a unit for reading of said group of cells comprising:

a plurality of internal data transmitting line pairs, said internal data transmitting line pairs corresponding to the number of memory cells of said group, and connecting means for connecting each of said internal data transmitting line pairs with each of a plurality of bit line pairs, wherein input connections from an internal data transmitting line pair to a corresponding bit line pair of at least one cell of said group of memory cells are the reverse of the input connections between the internal data transmitting line pairs and the corresponding bit line pairs of the remaining memory cells of said group to complement a corresponding at least one bit of said data written into said group of cells and output connections from said internal data transmitting line pair to said corresponding bit line pair of said at least one cell of said group of memory cells are correspondingly the reverse of the output connections between said internal data transmitting line pairs and said corresponding bit line pairs of the remaining memory cells of said group to complement said corresponding at least one bit of data read from said group of cells.

7. A connection arrangement as recited in claim 6, wherein a set of input/output lines are used for both input and output of data to said memory cells and said reversed input connection and said reversed output connections comprise a single reversed connection of said set of input/output lines to a cell of said group of memory cells.

8. A connection arrangement as recited in claim 6, wherein during testing, test data of a common logic state is written into all memory cells of said group.

9. A dynamic-type semiconductor memory device comprising a plurality of memory cell arrays each including memory cells arranged in a matrix of rows and columns;

each of said memory cell arrays comprising sets of bit lines for connecting memory cells of said columns to corresponding sense amplifiers;

a plurality of input and output data transmission line pairs for transferring data to be written or to be read, the number of said plurality of input and output data transmission line pairs corresponding to the number of memory cell arrays;

means for selecting simultaneously a number of memory cells in each memory cell array corresponding to the number of said plurality of input and output data transmission line pairs, in response to an externally applied address; and connecting means for connecting the simultaneously selected memory cells, through respective bit lines and sense amplifiers, with respective ones of said plurality of input and output data transmission line pairs in predetermined relationships;

wherein the connection between the bit lines and the input and output data transmission line pairs of at least one, but not all of the memory cell arrays, is the reverse of the connections between the bit lines and the input and output data transmission line pairs for the remaining memory cells arrays.

10. A dynamic-type semiconductor memory device as recited in claim 9 further comprising generating means for generating a test mode designating signal;

test write-in data means, responsive to said test mode designating signal, for simultaneously applying test mode data to said data transmission lines, wherein inverted write-in data are stored in the selected memory cells of said at least one memory cell array having the reverse connection and non-inverted write-in data are stored in the selected memory cells of the remaining memory cell arrays having non-reverse connections;

accessing means for simultaneously accessing and reading said selected memory cells, wherein the data stored in the selected cells of the memory cell arrays having reversed connection relationship are inverted and applied to corresponding data transmission lines and the stored data of the selected memory cells in said remaining memory cells arrays are applied in non-inverted form to corresponding data transmission lines; and logic means activated in response to said test mode designating signal for receiving all of the data from said data transmission lines and outputting a logic value corresponding to the data received.

11. A dynamic-type semiconductor memory device including a plurality of memory array blocks, each of said memory array blocks including a plurality of memory cells each of which cell stores information therein, and operable in a test mode operation for simultaneously selecting a predetermined number of memory cells from said plurality of memory array blocks, simultaneously writing information in said predetermined number of memory cells selected, and then simultaneously reading information stored in said predetermined number of memory cells, and estimating reliability of said memory device according to the information read out, said device comprising:

generating means for generating an internal test mode signal designating said test mode;

selecting means activated in response to said internal test mode signal for simultaneously selecting said predetermined number of memory cells from said memory array blocks in accordance with a received address, wherein at least one memory cells is selected in each memory array block;

receiving means for receiving write-in data values externally applied;

writing means coupled to said receiving means for writing a data value inverted from the corresponding data value of said write-in data in at least one but not all memory cells of said predetermined number of memory cells simultaneously selected, and also simultaneously writing data values having the same corresponding values as that of said write-in data in the remaining memory cells of said predetermined number of memory cells simultaneously selected;

accessing means for accessing said predetermined number of memory cells simultaneously selected, said accessing means including reading means for inverting and reading the stored data of said at least one memory cell where said inverted data is written, and simultaneously reading the stored data of said remaining memory cells as they are; and logic means activated in response to said internal test mode signal for receiving all of the output data from said reading means and outputting a logic value corresponding to the data received.

12. A dynamic-type semiconductor memory device as recited in claim 11, wherein the memory cells simultaneously selected from said plurality of memory cell arrays have row and column addresses corresponding to each other.

13. A dynamic-type semiconductor memory device including a plurality of memory array blocks, each of said memory array blocks including a plurality of memory cells each of which cells storing information therein, and operable in a test mode operation for simultaneously selecting a predetermined number of memory cells from said plurality of memory array blocks, simultaneously writing information in said predetermined number of memory cells selected, and then simultaneously reading information stored in said predetermined number of memory cells, and estimating reliability of said memory device according to the information read out, said device comprising:

generating means for generating an internal test mode signal designating said test mode;

selecting means activated in response to said internal test mode signal for simultaneously selecting said predetermined number of memory cells from said memory array blocks in accordance with a received address, wherein at least one memory cells is selected in each memory array block;

receiving means for receiving write-in data values externally applied;

writing means coupled to said receiving means for writing a data value inverted from the corresponding data value of said write-in data in at least one but not all memory cells of said predetermined number of memory cells simultaneously selected, and also simultaneously writing data values having the same corresponding values as that of said write-in data in the remaining memory cells of said predetermined number of memory cells simultaneously selected;

accessing means for accessing said predetermined number of memory cells simultaneously selected, said accessing means including reading means for inverting and reading the stored data of said at least one memory cell where said inverted data is written, and simultaneously reading the stored data of said remaining memory cells as they are; and logic means activated in response to said internal test mode signal for receiving all of the output data from said reading means and outputting a logic value corresponding to the data received, wherein each said memory array block comprises a plurality of bit line pairs, each bit line pair having a first bit line to which data of a memory cell is transmitted, and a second bit line to which data complementary to the data on said first bit line is transmitted, and said writing means and reading means each comprise a plurality of internal data transmitting line pairs, said internal data transmitting line pairs corresponding in number to memory cells selected simultaneously, and connecting means for connecting each of said internal data transmitting line pairs with each of said predetermined number of memory cells simultaneously selected through associated bit line pairs, connection of at least one bit line pair associated with said at least one selected memory cell to the related internal data transmitting line pair being the reverse of the connections of the bit line pairs associated with each of said remaining selected memory cells to the related internal data transmitting line pairs.

14. A method of performing a functional testing of a dynamic-type semiconductor memory device comprising a plurality of memory array blocks each including a plurality of memory cell, each of said memory cells stores information therein, comprising the steps of:

generating a test mode signal designating a functional test mode;

simultaneously selecting from each of said memory array blocks a predetermined number of memory cells corresponding to a received address;

receiving write-in data externally applied;

writing a data value inverted from the corresponding data value of said write-in data in at least one but not all memory cells of said predetermined number of memory cells, and writing data values having the same corresponding values as that of said write-in data in the remaining memory cells of said predetermined number of memory cells, in response to said test mode signal;

accessing said predetermined number of memory cells simultaneously selected, inverting and reading stored data of said at least one memory cell in which said data inverted is written, and reading the stored data of said remaining memory cells of said predetermined number of memory cells in noninverted form; and output a logic value corresponding to the data read from said predetermined number of memory cells in response to said test mode signal.

15. A dynamic type memory device comprising:

a plurality of memory cells each for storing information;

test mode signal generating means for generating a test mode designating signal designating a test mode;

selection means receiving said test mode designating signal from said test mode signal generating means and for selecting simultaneously a predetermined number of memory cells from said plurality of memory cells according to an address signal when said test mode signal designates said test mode;

writing means for receiving external data and for writing a data value inverted from the corresponding data value of said external data inputted into at least one memory cell among said predetermined number of memory cells selected by said selecting means, and also writing data values having the same corresponding values as that of said external data inputted into at least one of the remaining memory cells of said predetermined number of memory cells selected by said selecting means, in the test mode;

reading means for reading out the data of a memory cell storing the data inverted from the value of said external data inputted, and inverting the read-out data to be output, and also for reading out the data of a memory cell storing data with the same value as said external data inputted to be output, in the test mode; and logic operation means for receiving the data outputted from said reading means to provide a logic value corresponding to the data received from said reading means.

16. A memory device according to claim 15, wherein said plurality memory cells are arranged in a memory cell array, and said memory cell array comprises a plurality of bit line pairs, each of said plurality of bit line pairs having a first bit line to which data of a selected memory cell are transmitted, and a second bit line to which data complementary to the data on said first bit line are transmitted, said writing means and said reading means comprise a plurality of internal data transmitting line pairs, the number of said plurality of internal data transmitting line pairs corresponding to the number of memory cells selected simultaneously, and connecting means for connecting each internal data transmitting line pair with corresponding bit line pairs, connection of the bit line pairs accessed memory cells to at least one but not all internal data transmitting line pairs being the reverse of the connection of the bit line pairs of corresponding accessed memory cells to the remaining internal data transmitting line pairs.

17. A method of performing a functional testing of a dynamic-type semiconductor memory device comprising a plurality of memory array blocks each including a plurality of memory cells each storing information therein, comprising the steps of:

generating a test mode signal designating a functional test mode;

simultaneously selecting from each of said memory array blocks a predetermined number of memory cells corresponding to a received address;

receiving write-in data externally applied;

writing a data value inverted from the corresponding data value of said write-in data in at least one but not all memory cells of said predetermined number of memory cells, and writing data values having the same corresponding values as that of said write-in data in the remaining memory cells of said predetermined number of memory cells, in response to said test mode signal;

accessing said predetermined number of memory cells simultaneously selected, inverting and reading stored data of said at least one memory cell in which said data inverted data value is written, and reading the stored data of said remaining memory cells of said predetermined number of memory cells in noninverted form; and output a logic value corresponding to the data read from said predetermined number of memory cells in response to said test mode signal, wherein said step of writing and said step of reading each include a step of inverting data only for a predetermined memory array block among said plurality of memory array blocks.

18. A dynamic type memory device comprising:

a plurality of memory cells each for storing information;

test mode signal generating means for generating a test mode designating signal designating a test mode;

selection means receiving said test mode designating signal from said test mode signal generating means and for selecting simultaneously a predetermined number of memory cells from said plurality of memory cells according to an address signal when said test mode signal designates said test mode;

writing means for receiving external data and for writing a data value inverted from the corresponding data value of said external data inputted into at least one memory cell among said predetermined number of memory cells selected by said selecting means, and also writing data values having the same corresponding values as that of said external data inputted into a remaining memory cell of said predetermined number of memory cells selected by said selecting means, in the test mode;

reading means for reading out the data of a memory cell storing the data inverted from the value of said external data inputted, and inverting the read-out data to be output, and also for reading out the data of a memory cell storing data with the same value as said external data inputted to be output, in the test mode; and logic operation means for receiving the data outputted from said reading means to provide a logic value corresponding to the data received from said reading means, wherein logic operation means for receiving the data outputted from said reading means to provide a logic value corresponding to the data received from said reading means, wherein said plurality of memory cells are arranged in a memory cell array, and said memory cell array has a plurality of subarray blocks; each of the subarray blocks has a plurality of bit line pairs; each of said bit line pairs has a first bit line to which the data of the memory cell selected are transmitted, and a second bit line to which the data complementary to the data on said first bit line are transmitted, said selecting means including means for selecting one memory cell from each of said subarray blocks, said writing means including a plurality of first internal data transmitting line pairs, one for each of said subarray blocks, said first internal data transmitting line pairs transmitting complementary internal write-in data pairs, and means for connecting said first internal data transmitting line pairs to the bit line pairs in the corresponding subarray blocks so that a manner of connection between the bit line pairs and the first internal data transmitting line pairs in at least one of the subarray blocks differs from a manner of connection therebetween in the remaining subarray blocks, and said reading means including a plurality of second internal data transmitting line pairs, one provided for each of said subarray blocks, each of said second internal data transmitting line pairs transmitting complementary internal read-out data pair, and means for connecting said second internal data transmitting line pairs to the bit line pairs in corresponding subarray blocks so that a manner of connection between the bit line pairs and the second internal data transmitting line pairs in at least one of the subarray blocks differs from a manner of connection between the bit line pairs and the second internal data transmitting line pairs in the remaining subarray blocks.

19. A dynamic-type semiconductor memory device including a plurality of memory array blocks, each of said memory array blocks including a plurality of memory cells each of which cells stores information therein, and operable in a test mode operation for simultaneously selecting a predetermined number of memory cells from said plurality of memory array blocks, simultaneously writing information in said predetermined number of memory cells selected, and then simultaneously reading information stored in said predetermined number of memory cells, and estimating reliability of said memory device according to the information read out, said device comprising:

generating means for generating an internal test mode signal designating said test mode;

selecting means activated in response to said internal test mode signal for simultaneously selecting said predetermined number of memory cells from said memory array blocks in accordance with a received address, wherein at least one memory cells is selected in each memory array block;

receiving means for receiving write-in data values externally applied;

writing means coupled to said receiving means for writing a data value inverted from the corresponding data value of said write-in data in at least one but not all memory cells of said predetermined number of memory cells simultaneously selected, and also simultaneously writing data values having the same corresponding values as that of said write-in data in the remaining memory cells of said predetermined number of memory cells simultaneously selected;

accessing means for accessing said predetermined number of memory cells simultaneously selected, said accessing means including reading means for inverting and reading the stored data of said at least one memory cell where said inverted data is written, and simultaneously reading the stored data of said remaining memory cells as they are; and logic means activated in response to said internal test mode signal for receiving all of the output data from said reading means and outputting a logic value corresponding to the data received, wherein each of said plurality of memory array block comprises a plurality of bit line pairs each of which pairs includes a first bit line having data of a selected memory cell transmitted thereon and a second bit line having data complementary to the data on said first bit line is transmitted thereon, said writing means and reading means each comprising a plurality of internal data transmitting line pairs provided respectively for each of said memory array blocks and connection means provided respectively for each of said memory array blocks for connecting a selected memory cell in a corresponding array block through a related bit line pair to a corresponding internal data transmitting line pair, connection of said connecting means corresponding to the memory array block related to said at least one memory cell being the reverse of the connection of said connecting means corresponding to the memory array block related to each of the remaining memory cells.

20. A dynamic-type semiconductor memory device including a memory cell array having a plurality of memory cells, each of said cells storing information therein, and operable in a test mode operation for simultaneously selecting a prescribed number of the memory cells in said memory cell array, simultaneously writing information in said prescribed number of memory cells selected, and then simultaneously reading information stored in said prescribed number of memory cells, and determining acceptability of said semiconductor memory device according to the information read out, said device comprising:

generating means for generating an internal test mode signal designating said test mode, selecting means activated in response to said test mode signal for simultaneously selecting said prescribed number of memory cells from said memory array in accordance with an address externally provided, receiving means for receiving write-in data externally applied, writing means coupled to said receiving means for writing a data value inverted from the value of said write-in data in at least one but not all memory cells of said prescribed number of memory cells selected, and also writing data values having the same corresponding values as that of said write-in data in the remaining memory cells of said selected prescribed number of selected memory cells, accessing means for accessing said selected prescribed number of selected memory cells, said accessing means including reading means for inverting and reading the stored data value of said at least one memory cell where said inverted data value is written, and reading the stored data values of said remaining memory cells as they are, and logic means activated in response to said test mode signal for receiving all of the output data from said reading means and outputting a logic value corresponding to the data received, wherein said memory cell array comprises a plurality of subarray blocks each having a plurality of bit line pairs, each of said bit line pairs having a first bit line to which a data value of a memory cell selected is transmitted, and a second bit line to which a data value complementary to the data value on said first bit line is transmitted, said selecting means comprises means for selecting one memory cell from each of said subarray blocks, said writing means comprises a plurality of first internal data transmitting line pairs at least one of which is provided for each of said subarray blocks, the number of said plurality of first internal data transmitting line pairs corresponding to the number of memory cells selected simultaneously, said first internal data transmitting line pairs transmitting complementary internal write-in data, and connecting means for connecting said first internal data transmitting line pairs to the bit line pairs in the corresponding subarray blocks in a first relationship in at least one but not all of the subarray blocks and in a second relationship, different from the first relationship, in the remaining subarray blocks, and said reading means comprises a plurality of second internal data transmitting line pairs, at least one of which is provided in each of said subarray blocks, the number of said plurality of second internal data transmitting line pairs corresponding also to the number of memory cells selected simultaneously, each of said second internal data transmitting line pairs transmitting complementary internal read-out data, and means for connecting said second internal transmitting line pairs to the bit line pairs in corresponding subarray blocks so that a manner of connection between the bit line pairs and the second internal data transmitting line pairs in at least one but not all of the subarray blocks differs from a manner of connection between the bit line pairs and the second internal data transmitting line pairs in the remaining subarray blocks.

* * * * *